(12) United States Patent
Yang et al.

(10) Patent No.: US 12,009,676 B2
(45) Date of Patent: Jun. 11, 2024

(54) SIMULTANEOUS WIRELESS INFORMATION AND POWER TRANSFER DEVICE AND METHOD BASED ON THE MODULATION OF POWER SUPPLY RIPPLE OF MAGNETRON

(71) Applicant: Sichuan University, Sichuan (CN)

(72) Inventors: Yang Yang, Sichuan (CN); Huacheng Zhu, Sichuan (CN)

(73) Assignee: Sichuan University, Sichuan (CN)

( * ) Notice: Subject to any disclaimer, the term of this patent is extended or adjusted under 35 U.S.C. 154(b) by 0 days.

(21) Appl. No.: 17/964,842

(22) Filed: Oct. 12, 2022

(65) Prior Publication Data

US 2023/0030516 A1 Feb. 2, 2023

(30) Foreign Application Priority Data

Oct. 14, 2021 (CN) .......................... 202111195850.8

(51) Int. Cl.
*H01J 25/54* (2006.01)
*H02J 50/20* (2016.01)
(Continued)

(52) U.S. Cl.
CPC .............. *H02J 50/20* (2016.02); *H01J 25/54* (2013.01); *H02J 50/80* (2016.02); *H03B 9/10* (2013.01); *H04B 5/79* (2024.01)

(58) Field of Classification Search
CPC .. H01J 25/50; H01J 25/52; H01J 25/54; H01J 25/55; H01J 25/56; H01J 25/58;
(Continued)

(56) References Cited

U.S. PATENT DOCUMENTS 2,147,182 A * 2/1939 Wolff ...................... H01J 25/52
331/93
2,590,373 A * 3/1952 Bradley ................... H03C 3/32
332/132
(Continued)

FOREIGN PATENT DOCUMENTS

KR 20160142448 A * 12/2016 ............... H03B 9/10

OTHER PUBLICATIONS

I. Tahir, A. Dexter and R. Carter, "Frequency and phase modulation performance of an injection-locked CW magnetron," in IEEE Transactions on Electron Devices, vol. 53, No. 7, pp. 1721-1729, Jul. 2006, doi: 10.1109/TED.2006.876268.
(Continued)

*Primary Examiner* — Levi Gannon

(57) ABSTRACT

A SWIPT (simultaneous wireless information and power transfer) device based on the modulation of power supply ripple of magnetron includes a magnetron power supply, a magnetron, an IF (intermediate frequency) signal generator and a first capacitor. The first and second cathode power lines are provided between two ends of the magnetron power supply and two ends of the cathode of the magnetron respectively. One end of the first capacitor is connected with the IF signal generator, and another end of the first capacitor is connected with the first cathode power line. A SWIPT method includes applying an IF signal which is equivalent to the ripple of anode voltage of the magnetron to the anode voltage of the magnetron; taking a resonance signal excited by the magnetron as a local oscillation signal; generating a new signal at an output end of the magnetron, and radiating the new signal through an antenna.

4 Claims, 8 Drawing Sheets

(51) Int. Cl.
*H02J 50/80* (2016.01)
*H03B 9/10* (2006.01)
*H04B 5/79* (2024.01)

(58) Field of Classification Search
CPC ........ H01J 25/587; H01J 25/593; H01J 25/60; H02J 50/20; H02J 50/23; H02J 50/80; H03B 9/10; H04B 5/0031; H04B 5/0037
See application file for complete search history.

(56) References Cited

U.S. PATENT DOCUMENTS

| | | | | |
|---|---|---|---|---|
| 3,784,781 | A | * | 1/1974 | Foerstner ................. H03B 9/10 315/307 |
| 4,002,875 | A | * | 1/1977 | Kiuchi ...................... F24C 7/02 219/601 |
| 2020/0178359 | A1 | * | 6/2020 | Yang ...................... H05B 6/683 |

OTHER PUBLICATIONS

I. Tahir, A. Dexter and R. Carter, "Noise performance of frequency- and phase-locked CW magnetrons operated as current-controlled oscillators," in IEEE Transactions on Electron Devices, vol. 52, No. 9, pp. 2096-2103, Sep. 2005, doi: 10.1109/TED.2005.854276.

M. Read et al., "A 100-KW 1300-MHz Magnetron With Amplitude and Phase Control for Accelerators," in IEEE Transactions on Plasma Science, vol. 47, No. 9, pp. 4268-4273, Sep. 2019, doi: 10.1109/TPS.2019.2932264.

B. Yang, T. Mitani and N. Shinohara, "Evaluation of the Modulation Performance of Injection-Locked Continuous-Wave Magnetrons," in IEEE Transactions on Electron Devices, vol. 66, No. 1, pp. 709-715, Jan. 2019, doi: 10.1109/TED.2018.2877204.

B. Yang, J. Chu, T. Mitani and N. Shinohara, "High-Power Simultaneous Wireless Information and Power Transfer System Based on an Injection-Locked Magnetron Phased Array," in IEEE Microwave and Wireless Components Letters, vol. 31, No. 12, pp. 1327-1330, Dec. 2021, doi: 10.1109/LMWC.2021.3104832.

X. Chen, Z. Yu, H. Lin, X. Zhao and C. Liu, "Improvements in a 20-KW Phase-Locked Magnetron by Anode Voltage Ripple Suppression," in IEEE Transactions on Plasma Science, vol. 48, No. 6, pp. 1879-1885, Jun. 2020, doi: 10.1109/TPS.2019.2956868.

Y. Zhou, Y. Zhang, H. Zhu and Y. Yang, "Study of the Influence of Power Supply Ripple on Magnetron's Output Spectrum," in IEEE Transactions on Electron Devices, vol. 68, No. 9, pp. 4698-4704, Sep. 2021, doi: 10.1109/TED.2021.3097317.

* cited by examiner $$V_{RF}(t) = V_{dc} \times \left( \frac{\frac{2RC}{RC\omega_0 + Q_L} \frac{Q_L e^{\frac{(RC\omega_0 + Q_L)t}{2RC Q_L}}}{2RC} + A \cdot \left( \frac{-2\pi f \frac{e^{\frac{(RC\omega_0 + Q_L)t}{2RC Q_L}}}{2RC} \cos(2\pi f t) + \left(\frac{\omega_0}{2Q_L} + \frac{1}{2RC}\right) \frac{e^{\frac{(RC\omega_0 + Q_L)t}{2RC Q_L}}}{2RC} \cdot \sin(2\pi f t)}{\left(\frac{\omega_0}{2Q_L} + \frac{1}{2RC}\right)^2 + 4\pi^2 f^2} \right)}{V_{dc} \times \left( \frac{2RC \cdot Q_L}{RC\omega_0 + Q_L} - \frac{2\pi \cdot Af}{\left(\frac{\omega_0}{2Q_L} + \frac{1}{2RC}\right)^2 + 4\pi^2 f^2}\right)} \right) e^{\frac{-(RC\omega_0 + Q_L) \cdot t}{2RC \cdot Q_L}}$$

Fig. 12

$$\omega(t) = \underbrace{\omega' - \tan\alpha}_{} - \cfrac{\left(2(RC\omega_0 + Q_L) \cdot \left(\pi RCQ_L \cdot Af \cdot \left(\left(\frac{RC\omega_0}{4} + \frac{Q_L}{4}\right)\cos 2\pi ft + \pi \cdot RCQ_L \cdot f \cdot \sin 2\pi ft\right) \cdot e^{\frac{(RC\omega_0 + Q_L)t}{2RCQ_L}} + Q_L^2 \cdot \left((RC\pi f)^2 - \frac{ARC\pi f}{4} + \frac{1}{16}\right) - \frac{RC\omega_0 Q_L \left(RC\pi Af + \frac{1}{2}\right)}{4} + \frac{(RC\omega_0)^2}{16}\right)\right)}{RCQ_L \cdot \left(e^{\frac{(RC\omega_0 + Q_L)t}{2RCQ_L}} \cdot \left(Q_L RC\pi Af \cdot (RC\omega_0 + Q_L)\cos 2\pi ft - \frac{A(RC\omega_0 + Q_L)^2 \cdot \sin 2\pi ft}{4} + Q_L^2 \cdot (-(2\pi RCf)^2) - \frac{2RC\omega_0 Q_L}{4} + \frac{(RC\omega_0)^2}{4}\right) + Q_L^2 \cdot \left((2RC\pi f)^2 - ARC\pi f + \frac{1}{4}\right) - RC\omega_0 Q_L \left(RC\pi Af - \frac{1}{2}\right) + \frac{(RC\omega_0)^2}{4}\right)}$$

Fig. 13

SIMULTANEOUS WIRELESS INFORMATION AND POWER TRANSFER DEVICE AND METHOD BASED ON THE MODULATION OF POWER SUPPLY RIPPLE OF MAGNETRON

CROSS REFERENCE OF RELATED APPLICATION

The present invention claims priority under 35 U.S.C. 119(a-d) to CN 202111195850.8, filed Oct. 14, 2021.

BACKGROUND OF THE PRESENT INVENTION

Field of Invention

The present invention relates to the field of SWIPT (Simultaneous Wireless Information and Power Transfer), and more particularly to a simultaneous wireless information and power transfer device and method based on the modulation of power supply ripple of magnetron.

Description of Related Arts

SWIPT (Simultaneous Wireless Information and Power Transfer) is a new technology that is able to realize the synchronous transmission of energy and information. With the advantages of miniaturization, long distance, and deep integration of power flow and information flow, it breaks through the barriers between wireless energy transmission and wireless communication, and greatly improves spectrum resources and energy utilization. It has a wide range of military and civilian application scenarios, including wireless charging devices, battlefield environment sensors, no-man's-land sensors, space payloads, and environmental detection drones. In these scenarios, various sensors need to work for a long time and transmit information in real time, but it is difficult to realize cable connection and manual battery replacement. SWIPT is an effective means to ensure contactless charging and information transmission.

In the above application scenarios, the microwave source with high frequency and high transmit power is the key to realize miniaturization, long-distance energy transmission and large-capacity information transmission, and the magnetron has become the first choice of microwave source for such applications due to its advantages of high power to mass ratio, high efficiency and low cost.

In 2006, scientists such as I. Thair used the modulated signal as a small signal to inject and lock the S-band continuous wave magnetron, so as to realize SWIPT with the magnetron as a microwave source. At this time, the data transmission rate of PSK is able to reach 2 Mbps. In 2019, the Fermi National Accelerator Laboratory in the United States completed the modulation signal injection locking of the L-band 100 kW magnetron with a PM signal transmission rate of 50 kbps. In 2019, Kyoto University of Japan first proposed a SWIPT system based on magnetron transmitters. The PSK and FSK signals of the system reach a maximum of 10 Mbps. The system is the first wireless television system based on FM signal injection-locked magnetron transmitters in the world. The above scientific researches have proved the feasibility of the magnetron as a transmitter in SWIPT.

However, the above scientific researches focus on the role of the magnetron as a power amplifier in SWIPT, while ignoring the characteristics of the magnetron as an amplitude nonlinear response device, that is, the relationship between the input and output of the magnetron is a nonlinear curve. In the prior art, the IF (intermediate frequency) signal needs to be mixed by a mixer alone, and then amplified by a power amplifier and then inputted into a circulator connected with a magnetron for re-amplification, so as to realize SWIPT. The implementation method is complicated and the device cost is high.

SUMMARY OF THE PRESENT INVENTION

An object of the present invention is to provide a SWIPT (simultaneous wireless information and power transfer) device and method based on the modulation of power supply ripple of magnetron, which are able to solve the problems in the prior art that the magnetron is only used as a power amplifier, the realization of SWIPT is complicated, and the device cost is high.

Accordingly, in order to achieve the above object, the present invention provides technical solutions as follows.

A SWIPT (simultaneous wireless information and power transfer) device based on the modulation of power supply ripple of magnetron comprises a magnetron power supply, a magnetron, an IF (intermediate frequency) signal generator and a first capacitor, wherein:
  one end of the magnetron power supply is connected with one end of a first cathode power line;
  another end of the magnetron power supply is connected with one end of a second cathode power line;
  another end of the first cathode power line and another end of the second cathode power line are connected with two ends of a cathode of the magnetron respectively;
  one end of the first capacitor is connected with the IF signal generator; and
  another end of the first capacitor is connected with the another end of the first cathode power line.

Preferably, a first inductor is provided between the one end and the another end of the first cathode power line.

Preferably, a second inductor is provided between the one end and the another end of the second cathode power line.

Preferably, the SWIPT device further comprises a third inductor, wherein one end of the third inductor is connected with the IF signal generator, and another end of the third inductor is grounded.

Preferably, the SWIPT device further comprises a fourth capacitor, wherein one end of the fourth capacitor is connected with the one end of the first cathode power line, and another end of the fourth capacitor is grounded.

Preferably, the SWIPT device further comprises a fifth capacitor, wherein one end of the fifth capacitor is connected with the one end of the second cathode power line, and another end of the fifth capacitor is grounded.

Preferably, the SWIPT device further comprises a first resistor, a second resistor and a third resistor, wherein the first resistor is connected with the third inductor in parallel, the second resistor is connected with the first inductor in parallel, and the third resistor is connected with the second inductor in parallel.

Preferably, the SWIPT device further comprises an impedance matching adjuster which comprises a second capacitor and a third capacitor, wherein:
  one end of the second capacitor is connected with the IF signal generator;
  another end of the second capacitor is grounded; and
  the second capacitor is connected with the third capacitor in parallel.

Preferably, the second and third capacitors are adjustable.

A SWIPT (simultaneous wireless information and power transfer) method based on the modulation of power supply ripple of magnetron is performed by the SWIPT device. The SWIPT method comprises the steps of powering the magnetron with the magnetron power supply; generating an IF signal by the IF signal generator; inputting the IF signal to the first cathode power line through the first capacitor, wherein at this time, the IF signal which is equivalent to ripple of anode voltage of the magnetron is applied to the anode voltage of the magnetron, a resonance signal excited by the magnetron is used as a local oscillation signal; when the IF signal as the ripple of anode voltage interacts with the resonance signal of the magnetron, due to nonlinear response characteristics of the magnetron, generating a new signal at an output end of the magnetron, wherein a frequency of the new signal is obtained by a linear operation between a frequency of the IF signal and a frequency of the resonant signal, and radiating the new signal through an antenna.

The present invention has some beneficial effects as follows.

The present invention discloses a SWIPT device and a SWIPT method based on the modulation of power supply ripple of magnetron, which belongs to the field of SWIPT. The SWIPT device a magnetron power supply, a magnetron, an IF (intermediate frequency) signal generator and a first capacitor, wherein one end of the magnetron power supply is connected with one end of a first cathode power line; another end of the magnetron power supply is connected with one end of a second cathode power line; another end of the first cathode power line and another end of the second cathode power line are connected with two ends of a cathode of the magnetron respectively; one end of the first capacitor is connected with the IF signal generator; and another end of the first capacitor is connected with the another end of the first cathode power line. In the SWIPT method provided by the present invention, the IF signal is equivalent to the ripple of anode voltage of the magnetron and is applied to the anode voltage of the magnetron, the resonance signal excited by the magnetron is used as the local oscillation signal, the new signal is generated at the output end of the magnetron by frequency mixing and power amplification of the magnetron, and then is radiated through the antenna, so that the SWIPT device is simple in structure and low in cost.

BRIEF DESCRIPTION OF THE DRAWINGS

FIG. 12 is a formula of a high-frequency output voltage $V_{RF}(t)$ in free oscillation state of the magnetron obtained by solving a real part expression.

FIG. 13 is a formula of a transient output frequency $\omega(t)$ in free oscillation state of the magnetron obtained by solving an imaginary part expression.

Figure 1:
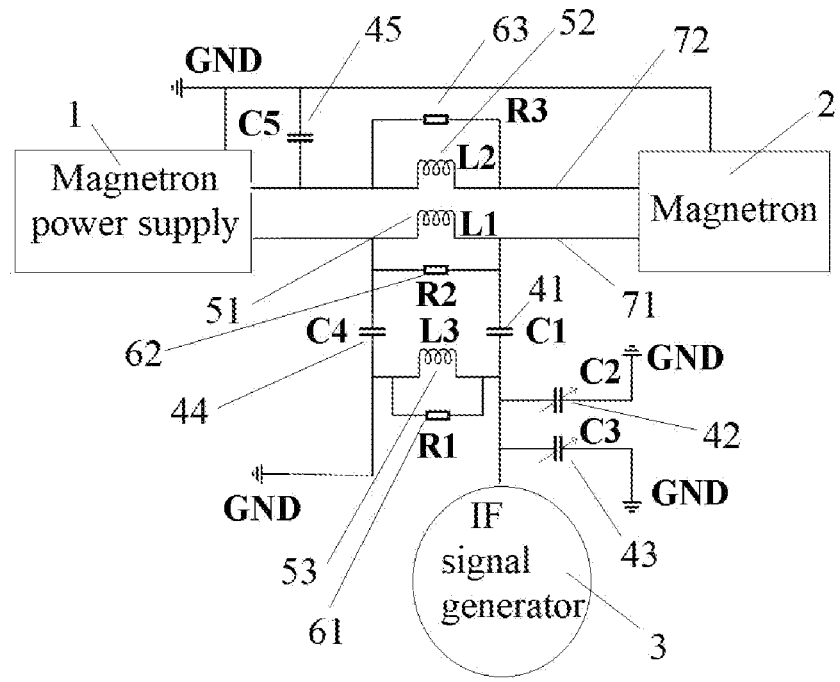
FIG. 1 is a circuit diagram of a SWIPT (simultaneous wireless information and power transfer) device based on the modulation of power supply ripple of magnetron provided by the present invention.

In the drawings, 1: magnetron power supply; 2: magnetron; 3: IF signal generator; 41: first capacitor; 42: second capacitor; 43: third capacitor; 44: fourth capacitor; 45: fifth capacitor; 51: first inductor; 52: second inductor; 53: third inductor; 61: first resistor; 62: second resistor; 63: third resistor; 71: first cathode power line; 72: second cathode power line.

DETAILED DESCRIPTION OF THE PREFERRED EMBODIMENT

The present invention will be further explained in detail with reference to accompanying drawings and specific embodiments as follows, but the present invention is not limited to the following embodiments.

First Embodiment

Referring to FIGS. 1 to 11, a SWIPT (simultaneous wireless information and power transfer) device based on the modulation of power supply ripple of magnetron is illustrated. The SWIPT device comprises a magnetron power supply 1, a magnetron 2, an IF (intermediate frequency) signal generator 3 and a first capacitor 41, wherein the magnetron power supply 1 is connected with one end of a first cathode power line 71 and one end of a second cathode power line 72 respectively, another end of the first cathode power line 71 and another end of the second cathode power line 72 are connected with two ends of a cathode of the magnetron 2 respectively, one end of the first capacitor 41 is connected with the IF signal generator 3, another end of the first capacitor 41 is connected with the another end of the first cathode power line 71. The working principle of the SWIPT device is explained as follows. The present invention makes full use of the characteristics of the magnetron as an amplitude nonlinear response device, combines the influence of the ripple of anode voltage of the magnetron on the output spectrum characteristics of the magnetron, and uses the magnetron as a mixer and a power amplifier of a SWIPT system. Accordingly, the problems of the prior art, that the IF signal needs to be frequency-mixed separately by the mixer, are solved. Moreover, no complex structure of multi-stage amplification, through which the IF signal is primarily amplified by the power amplifier and then is inputted into a circulator which is connected with the magnetron for re-amplification, is required. The present invention realizes SWIPT, eliminates the mixer and the circulator, and uses the magnetron as the mixer and the power amplifier in the SWIPT system for multifunctional use, thereby saving the cost. The magnetron power supply 1 is configured to provide the magnetron 2 with power. The IF signal generator 3 is configured to generate a modulated IF signal. The modulated IF signal is inputted to the first cathode power line 71 through the first capacitor 41, and at this time, the IF signal, which is equivalent to the ripple of anode voltage of the magnetron 2, is applied to the anode voltage of the magnetron 2, and a resonant signal excited by the magnetron 2 itself is used as a local oscillation signal. When the IF signal, which acts as the ripple of anode voltage, interacts with the resonant signal of the magnetron 2, the nonlinear response characteristic of the magnetron 2 causes that a new signal is generated at an output end of the magnetron 2, and the frequency of the new signal is obtained by a linear operation between the frequency of the IF signal and the frequency of the resonant signal, thereby achieving the purpose of using the magnetron for frequency mixing. In addition, according to the existing scientific research, the magnetron also has the function of a power amplifier, that is, the microwave signal generated by the frequency mixing is able to be radiated directly through an antenna.

The magnetron 2 comprises a cylindrical anode, wherein multiple anode blades are evenly radially spaced and installed on an inner wall of the cylindrical anode, a spiral filament acts as a cathode which is located at a center of the magnetron 2, an antenna is installed on one of the multiple anode blades, multiple cooling fins are arranged on an outer circumferential surface of the cylindrical anode, two magnets are installed at a top and a bottom of the cylindrical anode respectively to form a magnetic field. The magnetron power supply 1 provides the cathode of the magnetron 2 with power through the first cathode power line 71 and the second cathode power line 72, and heats the spiral filament to emit hot electrons, and then under the action of electric and magnetic fields, with the help of multiple resonant cavities formed by the anode blades, while doing cycloid motion, the hot electrons convert electron energy into high-frequency energy, that is, microwaves, and then the microwaves are radiated through the antenna. The magnetron power supply 1 provides 3.3 V for the cathode of the magnetron 2, the anode of the magnetron 2 is grounded, and there is a negative high-voltage of about 4 kV between the cathode and the anode of the magnetron 2.

The another end of the first cathode power line 71 and the another end of the second cathode power line 72 are directly or indirectly connected with the two ends of the cathode of the magnetron 2 respectively. The another end of the first cathode power line 71 and the another end of the second cathode power line 72 are connected with the two ends of the cathode of the magnetron 2 through choking coils respectively. The first capacitor 41 is used to block DC (direct current) and communicate AC (alternating current), so as to prevent the high-voltage DC of the magnetron power supply 1 from flowing into the IF signal generator 3, and at the same time to ensure that the modulated IF signal generated by the IF signal generator 3 is able to be inputted to the first cathode power line 71.

Figure 2:
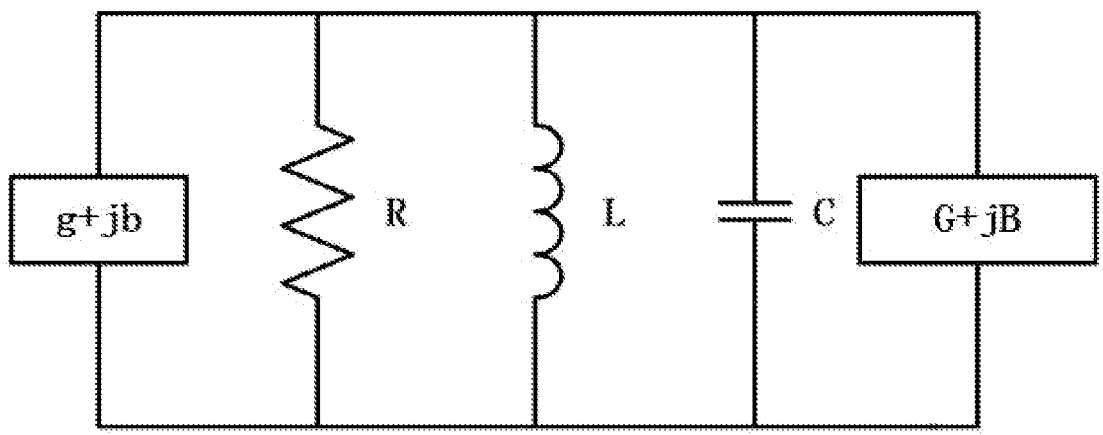
FIG. 2 is an equivalent circuit diagram of a magnetron, in which according to the research on the structure and function of a resonant cavity of the magnetron, the resonant cavity of the magnetron is able to be equivalent to an RLC (resistor-inductor-capacitor) parallel resonant circuit, g+jb is an equivalent power source of the magnetron, G+jB is an equivalent load, R, L and C are an equivalent resistor, an equivalent inductor and an equivalent capacitor, respectively.

Theoretical Analysis:

Referring to FIG. 2, based on the equivalent RLC (resistor-inductor-capacitor) resonant circuit model of the magnetron 2, circuit equations of the magnetron in free oscillation state are as follows:

$$\frac{g+jb}{C\omega_0} = j\left(\frac{\omega}{\omega_0} - \frac{\omega_0}{\omega}\right) + \frac{1}{Q_0} + \frac{G+jB}{Q_{ext}},$$

$$b - b_0 - g\tan\alpha$$

$$g = \frac{1}{R}\left(\frac{V_{dc}(1 + A(2\pi f t))}{V_{RF}} - 1\right),$$

where, ω is the oscillation frequency of the magnetron, that is, the oscillation frequency of the signal generated at the output end of the magnetron; $\omega_0$ is the local oscillator frequency of the resonant cavity, that is, the frequency of the resonance signal excited by the magnetron itself as the local oscillator signal; $Q_0$ is the intrinsic quality factor of the resonant circuit; $Q_{ext}$ is the external loaded quality factor of the resonant circuit; $V_{dc}$ is the anode voltage of the magnetron, that is, the voltage between the cathode and the anode of the magnetron while the anode is grounded; $V_{RF}$ is the high-frequency voltage, that is, the voltage of the signal generated at the output end of the magnetron; A is the amplitude coefficient of the IF signal; f is the frequency of the IF signal; g+jb is the equivalent magnetron power supply, g is the electronic conductance of the equivalent magnetron power supply, b is the electronic susceptance of the equivalent magnetron power supply; G+jB is the equivalent load, G is the electronic conductance at the load end, B is the electronic susceptance at the load end, j is the imaginary unit; $b_0$ and tanα are constants; R, L and C are the equivalent resistor, the equivalent inductor and the equivalent capacitor respectively; t is the time variable. J. C. Slater published a paper titled "*THE PHASING OF MAGNETRONS*" on Apr. 3, 1947, in which the above theoretical principles are described in detail, which is now common knowledge in the field and is able to be used directly.

In order to analyze the start-up process of the magnetron, in the process of initial oscillation, it is able to be assumed that the amplitude of the voltage of the magnetron changes exponentially with time, the frequency is expressed as a complex number whose imaginary part represents the exponential growth relationship, that is, $$\omega = \omega_1 + j\omega_2.$$

The relationship of high-frequency voltage versus time is expressed by a formula of $V_{RF} = e^{-\omega_2 t} e^{j\omega_1 t}$. Accordingly, $$\Gamma(t) = \frac{1}{V_{RF}} \frac{dV_{RF}}{dt}, \omega = \omega_1 + j\Gamma(t),$$

at this time, the circuit equation of the magnetron in free oscillation state is $$\frac{g+jb}{C\omega_0} = j\left(\frac{\omega - j\Gamma(t)}{\omega_0} - \frac{\omega_0}{\omega - j\Gamma(t)}\right) + \frac{1}{Q_0} + \frac{G+jB}{Q_{ext}}.$$

The real and imaginary parts of the above formula are separated, it is able to be obtained that $$\frac{g}{C\omega_0} = \frac{1}{Q_L} + \frac{2}{\omega_0}\Gamma(t)$$

$$\frac{b}{C\omega_0} = 2\frac{\omega - \omega_0}{\omega_0} + \frac{B}{Q_{ext}},$$

where, $\frac{1}{Q_L} = \frac{1}{Q_0} + \frac{G}{Q_{ext}}$.

By solving the real part expression, the high-frequency output voltage in free oscillation state of the magnetron is expressed as follows:

$$V_{RF}(t) = \left( A \cdot \frac{\left( V_{dc} \times \left( \frac{2RC \cdot Q_L \cdot e^{\frac{(RC\omega_0 + Q_L)t}{2RCQ_L}}}{RC\omega_0 + Q_L} + \frac{\left( -2\pi f \cdot e^{\frac{(RC\omega_0+Q_L)t}{2RCQ_L}} \cdot \cos(2\pi f t) + \left(\frac{\omega_0}{2Q_L} + \frac{1}{2RC}\right) \cdot e^{\frac{(RC\omega_0+Q_L)t}{2RCQ_L}} \cdot \sin(2\pi f t) \right)}{\left(\frac{\omega_0}{2Q_L} + \frac{1}{2RC}\right)^2 + 4\pi^2 f^2} \right) }{2RC} - \frac{\frac{V_{dc} \times (2RC \cdot Q_L)}{RC\omega_0 + Q_L} - \frac{2\pi \cdot Af}{\left(\frac{\omega_0}{2Q_L} + \frac{1}{2RC}\right)^2 + 4\pi^2 f^2}}{2RC} \right) e^{\frac{-(RC\omega_0+Q_L)t}{2RC \cdot Q_L}}.$$

Meanwhile, by solving the imaginary part equation, the transient output frequency in free oscillation state of the magnetron is expressed as follows:

$$\omega(t) = \left( \omega' - \tan\alpha \cdot \frac{\left( \begin{array}{c} -(2(RC\omega_0 + Q_L) \cdot (\pi RCQ_L \cdot Af \cdot \\ \left(\left(\frac{RC\omega_0}{4} + \frac{Q_L}{4}\right) \cos 2\pi f t + \pi \cdot RCQ_L \cdot \\ f \cdot \sin 2\pi f t\right) \cdot e^{\frac{(RC\omega_0+W_L)t}{2SCQ_L}} + Q_L^2 \cdot \\ \left((RC\pi f)^2 - \frac{ARC\pi f}{4} + \frac{1}{16}\right) - \\ \frac{RC\omega_0 Q_L\left(RC\pi Af + \frac{1}{2}\right)}{4} + \frac{(RC\omega_0)^2}{16} \end{array} \right)}{RCQ_L \cdot \left( e^{\frac{(RC\omega_0+Q_L)t}{2RCQ_L}} \cdot (Q_L RC\pi Af \cdot \\ (RC\omega_0 + Q_L)\cos 2\pi f t - \frac{A(RC\omega_0 + Q_L)^2 \cdot \sin 2\pi f t}{4} + \\ Q_L^2 \cdot \left(-(2\pi RCf)^2\right) - \frac{2RC\omega_0 Q_L + (RC\omega_0)^2}{4} \right) + \\ Q_L^2 \cdot \left((2RC\pi f)^2 - ARC\pi f + \frac{1}{4}\right) - \\ RC\omega_0 Q_L\left(RC\pi Af - \frac{1}{2}\right) + \frac{(RC\omega_0)^2}{4} } \right),$$

where, $\omega' = \omega_0 + \frac{b_0}{2C} - \frac{B\omega_0}{2Q_{ext}} - \frac{\omega_0 \tan\alpha}{2Q_L}$.

The above formula shows that the frequency of the magnetron after stable operation includes three parts, wherein:

$\omega_0$ is the local oscillator frequency of the resonant cavity, $$\frac{b_0}{2C} - \frac{B\omega_0}{2Q_{ext}}$$

represents the frequency push-forward effect caused by electron beams, and $$\frac{\omega_0 \tan\alpha}{2Q_L}$$

represents the frequency pulling effect caused by the load.

Figure 3:
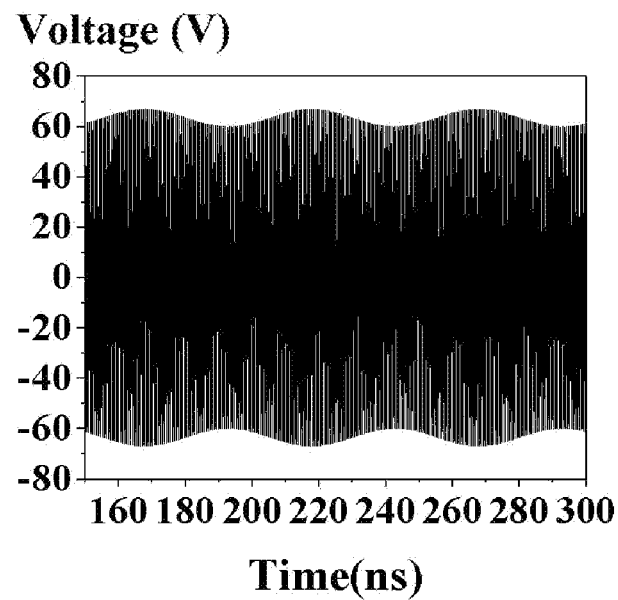
FIG. 3 is a time domain image of output signals of the magnetron, which plots an expression of the output signals in steady state of the magnetron whose anode voltage contains an IF (intermediate frequency) signal, wherein a depth of the sideband envelope represents an amplitude of the IF signal, and a frequency of the sideband envelope is related to a frequency of the IF signal.
Figure 4:
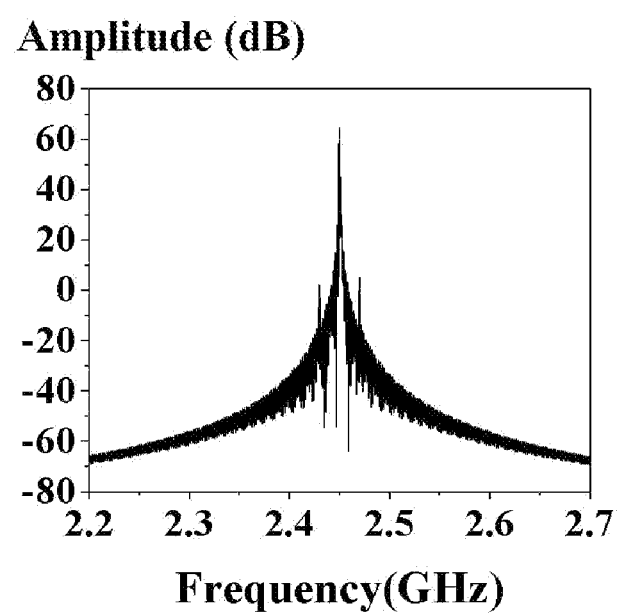
FIG. 4 is a frequency domain image of the output signals of the magnetron, which plots the fast Fourier transform of the derived expression, wherein a frequency point of the highest intensity in the image represents a central frequency of the magnetron, the weaker sub-frequency points on both sides of the central frequency represent new frequency points obtained by mixing the local frequency of the magnetron with the frequency of the IF signal, and a frequency difference between the central frequency and the sub-frequency is the frequency of the IF signal.

To sum up, while being loaded on the anode voltage of the magnetron, the IF signal is equivalent to the ripple of anode voltage, the output signal of the magnetron in free oscillation state is expressed as $V(t) = V_{RF}(t) \cdot \sin(\omega(t) \cdot t).$ By applying fast Fourier transform to the output expression of the magnetron which is derived theoretically from the above description, the corresponding frequency domain diagram is obtained. FIG. 3 is a time domain image of output signals of the magnetron, which plots the expression of the output signals in steady state of the magnetron whose anode voltage contains the IF signal, wherein a depth of the sideband envelope represents an amplitude of the loaded IF signal, and a frequency of the sideband envelope is related to a frequency of the IF signal. FIG. 4 is a frequency domain image of the output signals of the magnetron, which plots the fast Fourier transform of the derived expression, wherein a frequency point of the highest intensity in the image represents a central frequency of the magnetron, the weaker sub-frequency points on both sides of the central frequency represent new frequency points obtained by mixing the local oscillator frequency of the magnetron with a frequency of the IF signal, and a frequency difference between the central frequency and the sub-frequency is the frequency of the IF signal. According to the frequency domain image outputted by the magnetron, the weaker sub-frequency components appear on both sides of the central frequency of the output signals of the magnetron, and the frequency difference between the central frequency and the sub-frequency component is the frequency of the IF loaded on the anode voltage, which means that the magnetron acts as the intended mixer.

Figure 5:
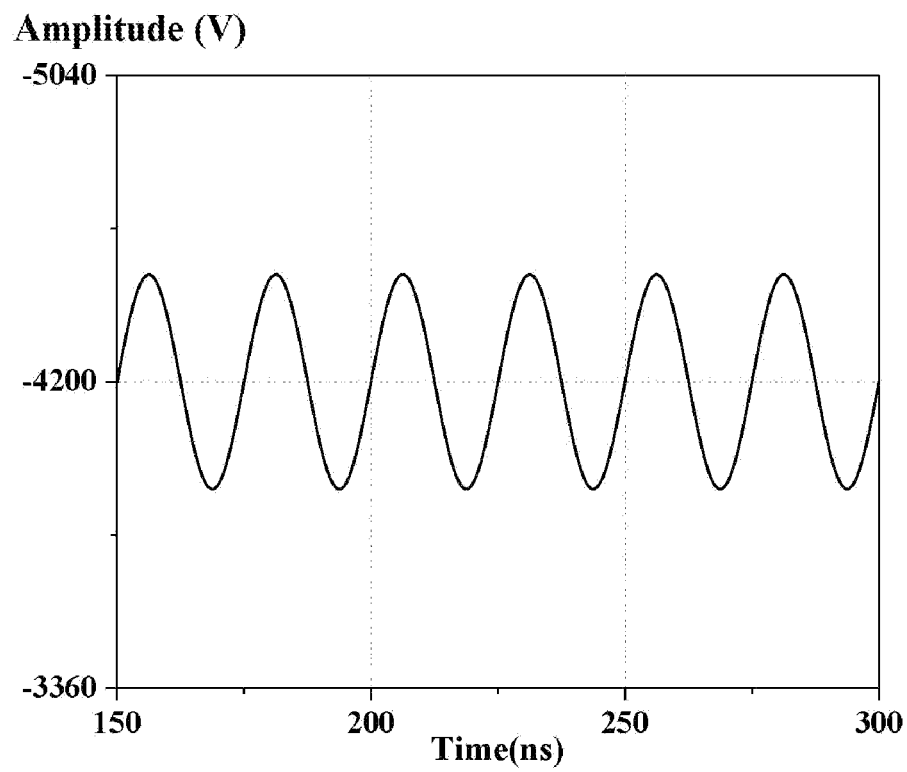
FIG. 5 is a waveform diagram of the anode voltage of the magnetron loaded with the IF signal, in which the original ideal anode voltage is a DC (direct current) voltage, the loaded IF signal acts as a ripple component on the DC voltage, and here, the complex IF signal carrying information is simplified to a sinusoidal signal with a single frequency.
Figure 6:
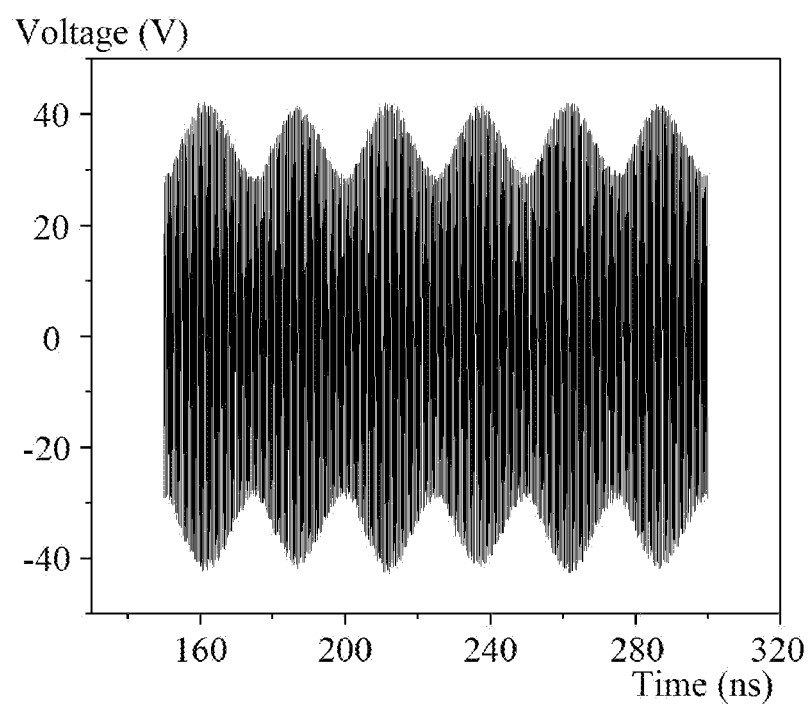
FIG. 6 is a time domain image of the output signals of the magnetron in free oscillation state, wherein the magnetron is modeled by electromagnetic simulation software, the time domain output image of the magnetron in free oscillation state is obtained by simulation calculation, the characteristics of the sideband envelope in FIG. 6 are similar to those in FIG. 3.
Figure 7:
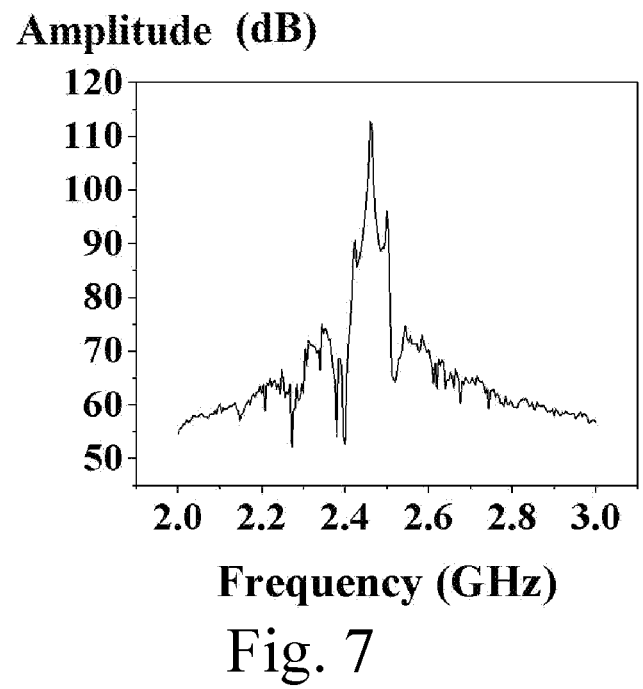
FIG. 7 is a frequency domain image of the output signals of the magnetron in free oscillation state, wherein the output spectrum of the magnetron is obtained by simulation calculation, the relationship characteristics between the central frequency and the sub-frequency in FIG. 7 are similar to those in FIG. 4.

FIG. 5 is a waveform diagram of the anode voltage of the magnetron loaded with the IF signal, in which the original ideal anode voltage is a DC voltage, the loaded IF signal acts as a ripple component on the DC voltage, and here, the complex IF signal carrying information is simplified to a sinusoidal signal with a single frequency. FIG. 6 is a time domain image of the output signals of the magnetron in the free oscillation state, wherein the magnetron is modeled by electromagnetic simulation software, the time domain output image of the magnetron in the free oscillation state is obtained by simulation calculation, the sideband envelope characteristics of FIG. 6 are similar to those of FIG. 3. FIG. 7 is a frequency domain image of the output signals of the magnetron in the free oscillation state, wherein the output spectrum of the magnetron is obtained by simulation calculation, the relationship characteristics between the central frequency and the sub-frequency in FIG. 7 are similar to those in FIG. 4. In the electromagnetic simulation software CST Studio Suite, the magnetron whose anode voltage is loaded with the IF signal as the equivalent ripple is simulated, and the obtained output spectrum also verifies that the magnetron is able to play the role of mixer at the transmitting end of the SWIPT system.

Figure 8:
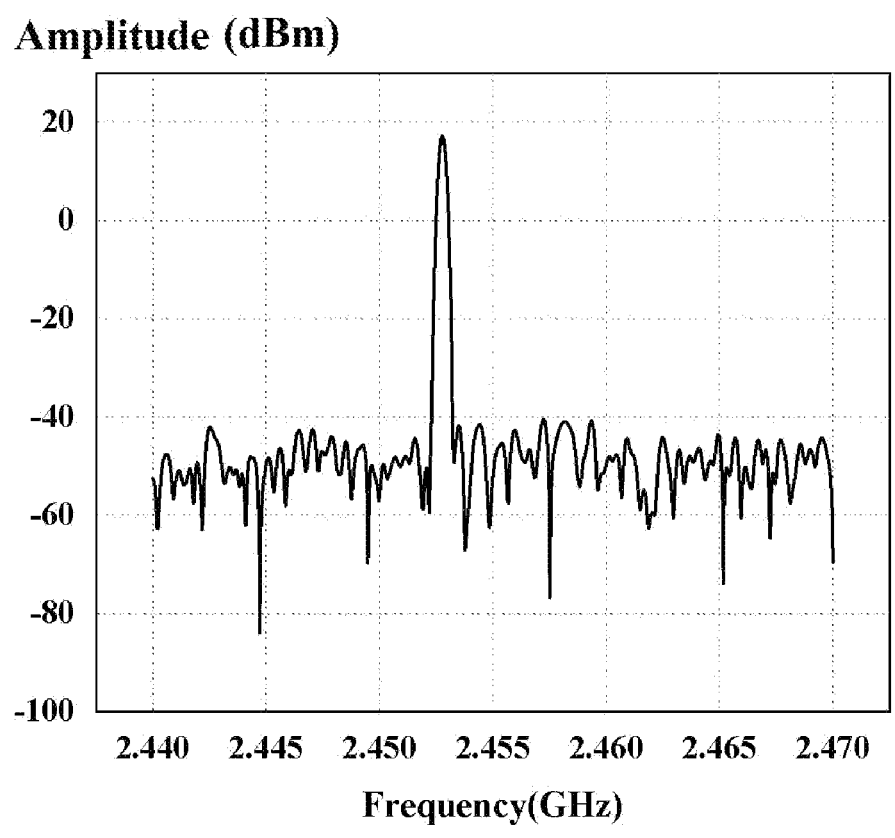
FIG. 8 is a frequency domain image of the output signals of the magnetron when the IF signal is not loaded, wherein the spectrum is an output spectrum of the 2M244-M1 magnetron produced by Panasonic in free oscillation state.
Figure 9:
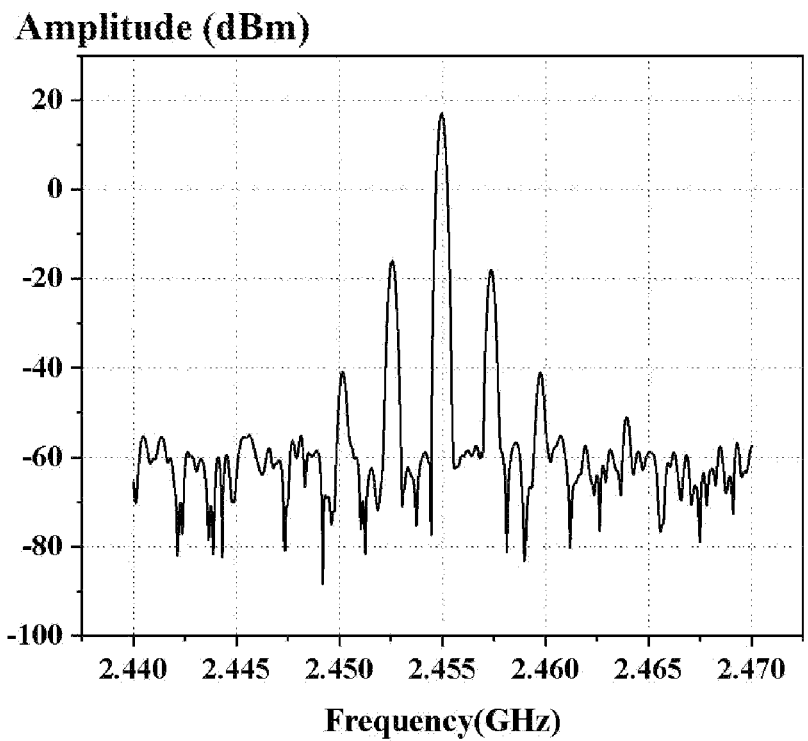
FIG. 9 is a frequency domain image of the output signals of the magnetron when a 2 MHz IF signal is loaded, wherein the relationship characteristics between the central frequency and the sub-frequency in FIG. 9 are similar to those in FIG. 4.
Figure 10:
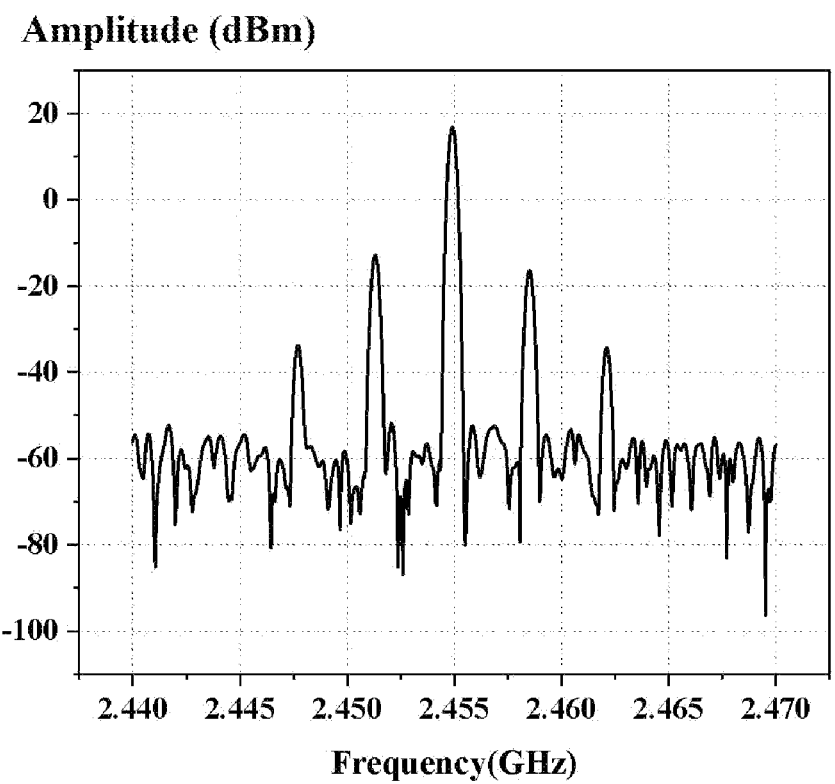
FIG. 10 is a frequency domain image of the output signals of the magnetron when a 3 MHz IF signal is loaded, wherein the relationship characteristics between the central frequency and the sub-frequency in FIG. 10 are similar to those in FIG. 4.
Figure 11:
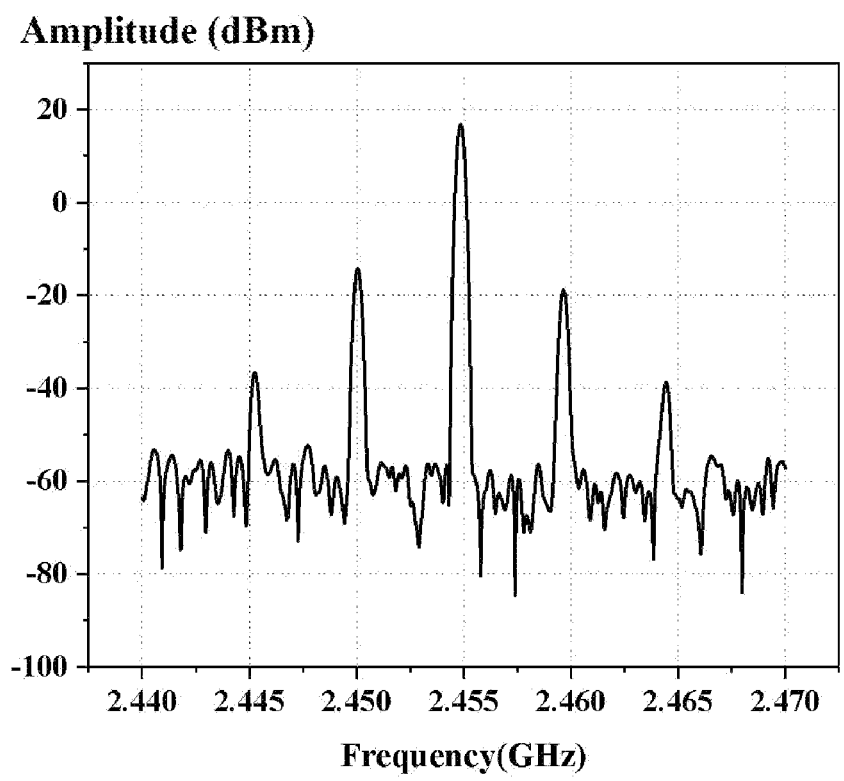
FIG. 11 is a frequency domain image of the output signals of the magnetron when a 4 MHz IF signal is loaded, wherein the relationship characteristics between the central frequency and the sub-frequency in FIG. 11 are similar to those in FIG. 4.

On this basis, the present invention builds a test system to verify the results of numerical calculation and software simulation. This system uses the 2M244-M1 magnetron produced by Panasonic. When the IF signal is not loaded, the output spectrum of the magnetron is shown in FIG. 8. FIGS. 9-11 show the output spectrum of the magnetron after loading IF signals of different frequencies respectively. The relationship characteristics between the central frequency and the sub-frequency in FIGS. 9-11 are similar to those in FIG. 4. The frequency difference between the central frequency and the sub-frequency is the frequency of the IF signal loaded on the anode voltage, indicating that the IF signal is equivalent to the ripple of anode voltage and is loaded on the anode voltage of the magnetron, and the resonance signal excited by the magnetron itself is used as the local oscillation signal. The magnetron is used for frequency mixing and power amplification to generate a new signal at the output end of the magnetron, and the new signal is directly radiated through the antenna, so that SWIPT is simple, and the cost is low.

Second Embodiment

As shown in FIGS. 1-11, on the basis of the first embodiment, a first inductor 51 is provided between the one end and the another end of the first cathode power line 71. It is able to known that the first inductor 51 is configured to block AC and communicate DC, to prevent the IF signal from flowing into the magnetron power supply 1, and at the same time to ensure that the high-voltage DC and the low-frequency filament current are able to enter the magnetron 2.

A second inductor 52 is provided between the one end and the another end of the second cathode power line 72. It is able to known that the second inductor 52 is configured to block AC and communicate DC, to prevent the IF signal from flowing into the magnetron power supply 1, and at the same time to ensure that the high-voltage DC and the low-frequency filament current are able to enter the magnetron 2.

The SWIPT device further comprises a third inductor 53, wherein one end of the third inductor 53 is connected with the IF signal generator 3, and another end of the third inductor is grounded. It is able to known that when the first capacitor 41 is short-circuited, the high voltage is directly applied to the IF signal generator 3, so the third inductor 53 is added. When the first capacitor 41 is short-circuited, the high-voltage DC is grounded through the third inductor 53. Therefore, the third inductor 53 plays the role of protecting the IF signal generator 3.

The SWIPT device further comprises a fourth capacitor 44, wherein one end of the fourth capacitor 44 is connected with the one end of the first cathode power line 71, and another end of the fourth capacitor 44 is grounded. It is able to be known that the fourth capacitor 44 is configured to prevent the high-frequency signal from flowing back the magnetron power supply 1.

The SWIPT device further comprises a fifth capacitor 45, wherein one end of the fifth capacitor 45 is connected with the one end of the second cathode power line 72, and another end of the fifth capacitor 45 is grounded. It is able to be known that the fifth capacitor 45 is configured to prevent the high-frequency signal from flowing back the magnetron power supply 1.

The SWIPT device further comprises a first resistor 61, a second resistor 62v and a third resistor 63, wherein the first resistor 61 is connected with the third inductor 53 in parallel, the second resistor 62 is connected with the first inductor 51 in parallel, and the third resistor 63 is connected with the second inductor 52 in parallel. It is able to be known that all of the first, second and third resistors 61, 62 and 63 are configured to reduce a Q value of the third, first and second inductors 53, 51 and 52 respectively for avoiding resonance.

The SWIPT device further comprises an impedance matching adjuster which comprises a second capacitor 42 and a third capacitor 43, wherein one end of the second capacitor 42 is connected with the IF signal generator 3, another end of the second capacitor 42 is grounded; and the second capacitor 42 is connected with the third capacitor 43 in parallel. It is able to be known that the impedance matching adjuster is for impedance matching with circuits.

The SWIPT device further comprises a circuit board, wherein the first, fourth and fifth capacitors 41, 44 and 45, the first, second and third inductors 51, 52 and 53, and the first, second and third resistors 61, 62 and 63 are integrated on the circuit board; the circuit board has a first port, a second port, a third port, a fourth port and a fifth port, wherein the first port is connected with the one end of the first cathode power line 71, the second port is connected with the one end of the second cathode power line 72, the third port is connected with the another end of the first cathode power line 71, the fourth port is connected with the another end of the second cathode power line 72, the fifth port is provided between the IF signal generator 3 and the first capacitor 41 for connecting the IF signal generator with the first capacitor. It is able to be known that the integration, of the first capacitor 41, the first inductor 51, the second inductor 52, the third inductor 53, the second capacitor 44, the third capacitor 45, the first resistor 61, the second resistor 62 and the third resistor 63 on the circuit board, is convenient for modular use and for direct connection the IF signal generator 3, the magnetron power supply 1 and the magnetron 2 with corresponding ports of the circuit board respectively, which is able to quickly realize SWIPT and is simple in structure.

Third Embodiment

Referring to FIGS. 1 to 11, a SWIPT (simultaneous wireless information and power transfer) method based on the modulation of power supply ripple of magnetron is illustrated, which is performed with the SWIPT device mentioned above. The SWIPT method comprises the steps of powering the magnetron 2 with the magnetron power supply 1, generating an IF signal by the IF signal generator 3, inputting the IF signal to the first cathode power line 71 through the first capacitor 41, wherein at this time, the IF signal which is equivalent to the ripple of anode voltage of the magnetron 2 is applied to the anode voltage of the magnetron 2, a resonance signal excited by the magnetron 2 itself is used as a local oscillation signal; when the IF signal as the ripple of anode voltage interacts with the resonance signal of the magnetron 2, due to nonlinear response characteristics of the magnetron 2, generating a new signal at the output end of the magnetron 2, wherein a frequency of the new signal is obtaining by a linear operation between a frequency of the IF signal and a frequency of the resonant signal, and radiating the new signal through an antenna. The method provided by the invention makes full use of the nonlinear response characteristics of the magnetron, combined with the influence of the ripple of anode voltage of the magnetron on its output spectrum characteristics, and uses the magnetron as the mixer and power amplifier in the SWIPT system. As a result, the problem that the IF signal in the prior art needs to be mixed alone by a frequency mixer is solved. Moreover, there is no need to adopt the complex structure of multi-stage amplification including a power amplifier for primary amplification and a circulator connected with a magnetron for re-amplification. The method provided by the present invention is able to realize SWIPT, saves the frequency mixer and the circulator, and has low cost.

The above descriptions are only preferred embodiments of the present invention, and are not intended to limit the scope of the present invention. Any equivalent structure or equivalent process transformation made by using the description and drawings of the present invention, or directly or indirectly applied to other related technical fields are similarly included in the protection scope of the present invention.

What is claimed is:

1. A SWIPT (simultaneous wireless information and power transfer) device based on magnetron modulation of power supply ripple of magnetron, the SWIPT device comprising a magnetron power supply, a magnetron, an IF (intermediate frequency) signal generator, a first capacitor, a first inductor, a second inductor, a third inductor and a fourth capacitor, wherein:
   one end of the magnetron power supply is connected with one end of a first cathode power line;
   another end of the magnetron power supply is connected with one end of a second cathode power line;
   another end of the first cathode power line and another end of the second cathode power line are connected with two ends of a cathode of the magnetron respectively;
   one end of the first capacitor is connected with the IF signal generator;
   another end of the first capacitor is connected with the another end of the first cathode power line;
   the first inductor is provided between the one end and the another end of the first cathode power line;
   the second inductor is provided between the one end and the another end of the second cathode power line;
   one end of the third inductor is connected with the IF signal generator, and another end of the third inductor is grounded;
   one end of the fourth capacitor is connected with the one end of the first cathode power line, and another end of the fourth capacitor is grounded;
   the SWIPT device further comprises a fifth capacitor, wherein one end of the fifth capacitor is connected with the one end of the second cathode power line, and another end of the fifth capacitor is grounded.

2. The SWIPT device according to claim 1, further comprising a first resistor, a second resistor and a third resistor, wherein the first resistor is connected with the third inductor in parallel, the second resistor is connected with the first inductor in parallel, and the third resistor is connected with the second inductor in parallel.

3. The SWIPT device according to claim 2, further comprising an impedance matching adjuster which comprises a second capacitor and a third capacitor, wherein:
   one end of the second capacitor is connected with the IF signal generator;
   another end of the second capacitor is grounded; and
   the second capacitor is connected with the third capacitor in parallel.

4. The SWIPT device according to claim 3, wherein the second and third capacitors are adjustable.

* * * * *